United States Patent [19]

Paul et al.

[11] Patent Number: 5,138,028

[45] Date of Patent: Aug. 11, 1992

[54] POLYIMIDES END-CAPPED WITH DIARYL SUBSTITUTED ACETYLENE

[75] Inventors: Charles W. Paul, Madison; Rose A. Schultz, Princeton; Steven P. Fenelli, Hillsborough, all of N.J.

[73] Assignee: National Starch and Chemical Investment Holding Corporation, Wilmington, Del.

[21] Appl. No.: 823,508

[22] Filed: Jan. 21, 1992

Related U.S. Application Data

[63] Continuation-in-part of Ser. No. 482,362, Feb. 20, 1990, abandoned.

[51] Int. Cl.$^5$ .................. C08G 69/26; C08G 8/02; C08G 75/00; C08F 22/40
[52] U.S. Cl. .................. 528/353; 526/262; 528/125; 528/128; 528/172; 528/208
[58] Field of Search ............... 528/353, 125, 128, 172, 528/208; 526/262

[56] References Cited

U.S. PATENT DOCUMENTS

| | | | |
|---|---|---|---|
| 3,845,018 | 10/1974 | Bilow et al. | 528/128 |
| 3,879,349 | 4/1985 | Bilow et al. | 528/125 |
| 4,405,770 | 9/1983 | Shocenberg et al. | 526/259 |
| 4,485,231 | 11/1984 | Landis | 528/125 |
| 4,506,100 | 3/1985 | Shoenberg et al. | 564/430 |
| 4,568,601 | 2/1986 | Araps et al. | 428/167 |
| 4,656,050 | 4/1987 | Araps et al. | 427/12 |
| 4,730,032 | 3/1988 | Rossi et al. | 526/285 |
| 4,749,621 | 6/1988 | Araps et al. | 428/473.5 |

OTHER PUBLICATIONS

T. Takeichi and J. K. Stille, *Macromolecules*, 19 2108 (1986).

M. R. Unroe, et al., *ACS Polymer Preprint*, 26 (1) 136 (1985).

F. Harris, et al., *J. Macromal Sci–Chem*, A21 (8+9) 1117 (1984).

P. M. Hergenrother, *Macromolecules*, 14 (4) 898–904 (1981).

*Primary Examiner*—John Kight, III
*Assistant Examiner*—T. Mosley
*Attorney, Agent, or Firm*—Edwin M. Szala; Ellen T. Dec

[57] ABSTRACT

Novel polyimide and polyisoimide oligomers and precursors thereof, end-capped with diaryl substituted acetylene.

These novel end-capped polyimide or polyisoimides oligomers are useful for composites, molding compounds, adhesives, and electronic applications.

32 Claims, No Drawings

POLYIMIDES END-CAPPED WITH DIARYL SUBSTITUTED ACETYLENE

This application is a continuation-in-part of application Ser. No. 07/482,362 filed Feb. 20, 1990, now abandoned.

BACKGROUND AND PRIOR ART OF THE INVENTION

The present invention relates to novel polyimide and polyisoimide resins end-capped with diaryl substituted acetylene (DASA) having high fusion temperatures, and to their use in composites, molding compounds, electronics and adhesives.

Polyimides are synthetic organic resins characterized by repeating imide linkages in the polymer chain which may or may not be end-capped with polymerizable or inert (i.e. non-polymerizable) chemical groups. They are available in both linear and crosslinked forms and are noted for their outstanding chemical and physical properties, particularly their high temperature oxidative stability and strength. In addition to their use as adhesives and molded articles, they may be used as precured films and fibers, curable enamels, laminating resins, and as matrices for fiber reinforced composites.

For many years polymer chemists have sought to attain materials which have a combination of three properties: 1) high use temperature; 2) toughness; and 3) processibility. In many applications, if high use temperature is required, the polymer must have a high Tg (glass transition temperature) as well as sufficient thermo-oxidative stability below its Tg. Aromatic polyimides have some of the highest use temperatures. However, prior art polyimides generally do not possess all three desired properties. Condensation polyimides are well known, see J. P. Critchley, G. J. Knight and W. W. Wright, "Heat-Resistant Polymers," Plenum Press, New York (1983), p. 185. Thermoplastic polyimides are generally tough, but either can be used at high temperatures (above 250° C.) or are easily processed, but not both. Thermoplastic polyimides with use temperatures above 250° C. must generally be processed at temperatures at which decomposition can become a problem (above 400° C.) in order to achieve an acceptably low melt viscosity. Even then, high melt viscosity can still create difficulties (see N. J. Johnston and T. L. St. Clair, SAMPE Journal, January/February 1987, p. 12).

To minimize problems with viscosity, lower molecular weight thermosetting polyimides have been used. The prior art discloses polyimide oligomers (n=3-11, where n is the number of repeat units in the polymer backbone) containing acetylene in the backbone, with uncured Tg's up to 196° C. See *Macromolecules*, 19, 2108 (1986). A low polyimide oligomer (n=0) with a phenyl-substituted acetylene end-cap and an uncured Tg of 111° C. is disclosed in *ACS Polymer Preprints*, 26 (1), 136 (1985). A polyimide oligomer (n=1) containing 5,5'-[2,2,2-trifluoro-1-(trifluoromethyl)ethylidene]bis-1,3-isobenzofurandione (6FDA) [alternatively named 2,2-bis(3,4-dicarboxyphenyl)hexafluoropropane dianhydride], 1,3-bis(3-aminophenoxy)benzene (APB), and end-capped with 3-phenylethynylaniline, and with an uncured Tg of 120° C. is disclosed in *ACS Polymer Preprints*, 25 (1), 110 (1984), *ACS Polymer Preprints*, 24 (2), 324 (1983), *J. Macromol. Sci.*—Chem., A21 (8+9), 1117 (1984).

Polyimides with unsubstituted acetylene end-caps such as aminophenylacetylene are described in U.S. Pat. Nos. 4,506,100 and 4,644,040. U.S. Pat. Nos. 3,845,018 and 3,879,349 issued on Oct. 29, 1974 and Apr. 22, 1975, respectively to N. Bilow et al.; and U.S. Pat. No. 4,405,770 issued on Sept. 20, 1983 to J. Schoenberg also described the preparation of aminophenylacetylene capped polyimide oligomers. See also Hergenrother, P. M., "Acetylene-terminated Imide Oligomers and Polymers Therefrom", Polymer Preprints, Am. Chem. Soc., Vol. 21 (#1), pgs, 81-83 (March 1980). European Patent Application No. 71,372 issued on Feb. 9, 1983 to A. Landis describes the preparation of aminophenylacetylene capped polyisoimide oligomers.

Most of the prior art thermosets tend to be brittle. It is well known that less brittle materials are obtained when the density of crosslinks is reduced (or, alternatively, the molecular weight between crosslinks is increased). However, as the molecular weight of the thermoset increases, its Tg in the uncured state will rise, and its Tg in the cured state will fall. The latter can be offset by changing the backbone of the thermoset to a more rigid structure thus raising the cured Tg. However, this will further increase the uncured Tg. At a sufficiently high uncured Tg the material will lose its processibility, not due to a high viscosity, but due to the fact that the curing reaction becomes too rapid at the required processing temperature. Thus the available processing time becomes too short.

Hence, there exists a need for novel polyimides and polyisoimides terminated with diaryl substituted acetylene (DASA) end caps which have high cured Tg, and toughness (via longer oligomers), while maintaining their processibility.

SUMMARY OF THE INVENTION

One embodiment of the present invention relates to a polymerizable oligomer selected from the group consisting of polyamic acids, corresponding amic esters, corresponding isoimides, corresponding imides, and mixtures thereof, and wherein said polymerizable oligomer is end-capped with a diaryl substituted acetylene (DASA) having the general formula:

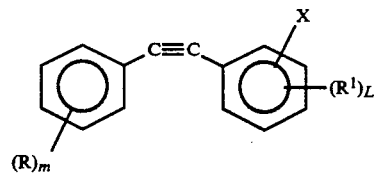

wherein m=0 to 5, L=0 to 4, R and $R^1$ are independently selected from the group consisting of halogen, $C_1$-$C_4$ alkyl, alkoxy, aryloxy, haloaryl, haloalkyl, haloacyl, aryl, and acyl, and X is a linking group to the oligomer backbone selected from the group consisting of $NH_2$, CHO, isocyanate, anhydride, carboxylic acid, ester, and acyl halide; provided that m or L≠0 when the oligomer backbone is composed of 2,2-bis(3,4-dicarboxyphenyl) hexafluoropropane dianhydride and 1,3-bis(3-amino-phenoxy) benzene and X=$NH_2$; and said polymerizable oligomer must have a glass transition temperature (Tg) greater than 135° C. after imidization, but prior to the onset of cure of the DASA end-caps. The imidized oligomers when cured will have a cured Tg of at least 220° C. and preferably at least 260° C.

In particular, the present invention relates to polyimide and polyisoimide oligomers end-capped with diaryl substituted acetylene (DASA) and have the general structure:

(DASA)—B$_p$—(AB)$_n$—A$_r$—(DASA)    1 wherein A is a diamine, B is a tetracarboxylic dianhydride, (AB)$_n$ is the reaction product of A and B, n is 0 to 100, p and r are 0 or 1, but p is 0 when r is 1, and p is 1 when r is 0, DASA is as described above.

The imidized oligomer 1 must have a glass transition temperature (Tg) greater than 135° C., prior to the onset of cure of the DASA end-caps, preferably greater than 160° C., and most preferably at least 190° C.

Another embodiment of the present invention relates to monomeric mixtures of A, DASA and B, wherein B is selected from the group consisting of either a tetracid, tetraester, or a diacid diester of a dianhydride, A and DASA are as defined above to produce the polymerizable oligomer 1 defined above upon heating.

The novel end-capped polyimide, or polyisomide oligomers are preferably prepared by:

(1) reacting a diamine with a tetracarboxlic dianhydride in the presence of a sufficient amount of an inert organic solvent to form a polyamic acid; and (2) reacting the resultant polyamic acid with a diaryl substituted acetylene end cap in an organic solvent, and (3) applying thermal or chemical dehydration to form the diaryl substituted acetylene capped polyimide or polyisomide oligomer.

In a further embodiment of the present invention, the polymerizable oligomer is end-capped with a diaryl substituted acetylene (DASA) having the general formula:

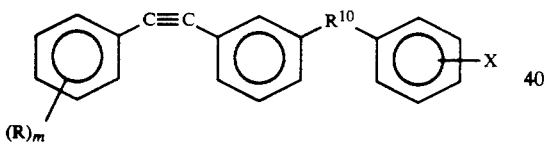

wherein m=0 to 5, R is selected from the group consisting of halogen, C$_1$-C$_4$ alkyl, alkoxy, aryloxy, haloaryl, haloalkyl, haloacyl, aryl and acyl, R$^{10}$ is —O—, —S—, —SO$_2$—,

—CH$_2$—, —C(CF$_3$)$_2$—, or —C(CH$_3$)$_2$—, and X is a linking group to the oligomer backbone selected from the group consisting of NH$_2$, CHO, isocyanate, anhydride, carboxylic acid, ester and acyl halide.

A further embodiment of the present invention relates to a novel process in which the phenylethynylnitrobenzene intermediate is reduced to the corresponding amine target DASA compound by treatment with a sulfide salt, such as Na$_2$S$_2$O$_4$.

A large number of both dianhydrides and diamines may be used in forming the polyimide or polyisoimide backbone. Preferably the dianhydride is selected from the groups consisting of 3,4,3'4'-biphenyltetracarboxylic dianhydride (BPDA); 3,4,3',4'-benzophenone tetracarboxylic dianhydride (BTDA); pyromellitic dianhydride (PMDA); 5,5'-[2,2,2-trifluoro-1-(trifluoromethyl)ethylidene]bis-1,3-isobenzofurandione, (6FDA) and 4,4'-oxydiphthalic dianhydride (ODPA)

Preferably the diamine is selected from the group consisting of phenylene diamines, oxydianiline (ODA), and [phenylene bis(methylethylidene]bis-benzenamine also referred to in the art as bisaniline.

Other dianhydrides and diamines may also be used in preparing the oligomers herein.

Or the various DASA end-capping reagents, the preferred end-caps are

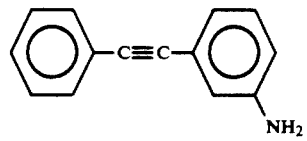

3-phenylethynyl aniline (3-PEA)

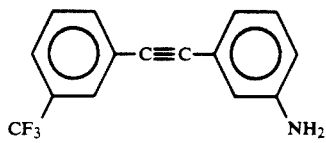

3-[3-(trifluoromethyl)phenylethynyl]aniline (3-CF$_3$-PEA)

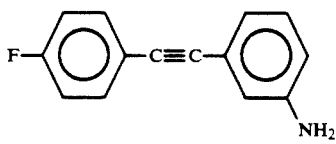

3-(4-fluorophenylethynyl)aniline (4-F-PEA)

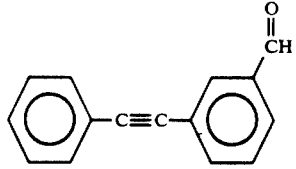

3-phenylethynylbenzaldehyde (3-PEB)

DETAILED DESCRIPTION

The starting materials for forming the polyimide or polyisoimide oligomer backbones herein are diamines and tetracarboxylic acid dianhydrides.

The organic diamines are characterized by the formula:

H$_2$N—Q—NH$_2$ wherein Q is an organic divalent radical selected from the group consisting of substituted and unsubstituted aliphatic, cycloaliphatic, heterocyclic, siloxane or aromatic groups and combinations thereof, either directly attached (e.g. biphenylene, naphthalene) or linked through bridging groups such as amide or ester, or bridging atoms such as C, O, N, S, Si, or P, and substituted groups thereof. A given diamine may contain a mixture of bridging groups.

Preferred Q groups include

-continued

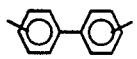

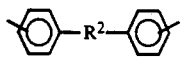

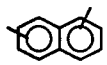

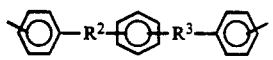

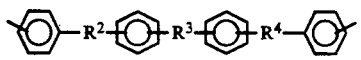

wherein $R^2$, $R^3$, and $R^4$ are independently selected from the group consisting of an amide, ester, an alkylene chain consisting of 1-3 carbon atoms such as

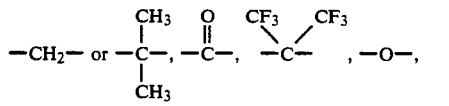

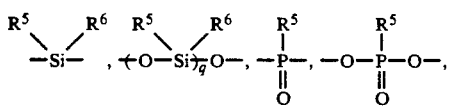

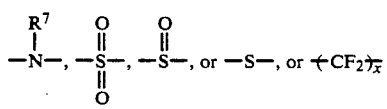

wherein $R^5$ and $R^6$ are alkyl and/or aryl, $R^7$ is $R^5$ or H, x is 1 to 10, and q is 1 to 25.

Preferred diamines include: meta-phenylene diamine; para-phenylenediamine; 2,2-bis(4-aminophenyl) propane; 4,4'-diamino diphenyl methane; 4,4'-diamino diphenyl sulfide; 4,4'-diamino diphenyl sulfone; 3,3'-diamino-diphenyl sulfone; 4,4'-oxydianiline; 2,6-diamino pyridine; bis-(4-aminophenyl) diethylsilane; bis-(4-aminophenyl) diphenylsilane; benzidine; 3,3'-dichlorobenzidine; 3,3'-dimethoxy benzidine; bis-(4-aminophenyl) ethyl phosphine oxide; bis-(4-aminophenyl) phenyl phosphine oxide; bis-(4-aminophenyl)-n-butylamine; bis-(4-aminophenyl) methylamine; 1,5-diamino naphthalene; 3,3'-dimethyl-4,4'-diaminobiphenyl; N-(3-aminophenyl)-4-aminobenzamide; 4-aminophenyl-3-aminobenzoate; bisaniline M-(4,4'-[1,3-phenylene bis(1-methylethylidene)]-bis(benzenamine); bisaniline P (4,4'-[1,4-phenylene bis(1-methyethylidene)]-bis(benzenamine); 3,3'-diaminobenzophenone; 2,2-bis(3-amino-4-methylphenyl)hexafluoropropane; 4,4'-bis(4-aminophenoxy)biphenyl; and mixtures thereof.

The tetracarboxylic dianhydrides are characterized by the following formula:

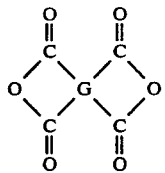

where G is a tetravalent radical selected from substituted and unsubstituted aliphatic, cycloaliphatic, heterocyclic, siloxane or aromatic groups and combinations thereof, either directly attached (e.g. biphenylene, naphthalene) or linked through bridging groups such as amide or ester, or bridging atoms such as C, O, N, S, Si, or P and substituted groups thereof. A given dianhydride may contain a mixture of bridging groups.

Preferred dianhydrides are those in which the G groups have at least 6 carbon atoms characterized by benzenoid unsaturation, i.e., resonating double bonds in an aromatic ring structure, wherein the 4 carbonyl groups of the dianhydride are each attached to separate carbon atoms and wherein the carbon atoms of each pair of carbonyl groups are directly attached to adjacent carbon atoms in the G group to provide a 5-membered ring as follows:

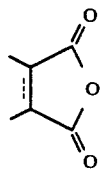

G groups include

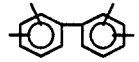

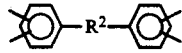

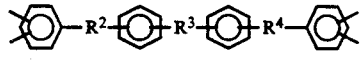

wherein $R^2$, $R^3$, and $R^4$ are as described above.

G and Q may be singly or multi substituted with one or more groups such as alkyl, haloalkyl, alkoxy, aryl, aryloxy, haloaryl, alkylaryl, and halogen. Specific examples of such substituents (for both the diamines and the dianhydrides) include fluorine, chlorine, bromine, methyl, ethyl, trifluoromethyl, phenyl, biphenyl, napthyl, phenoxy, perfluoro phenoxy, methoxy.

Any of the tetracarboxylic acid dianhydrides known in the prior art can be used. Among the useful dianhydrides are 3,3',4,4'-benzophenone tetracarboxylic dianhydride; pyromellitic dianhydride; 2,3,6,7-naphthalene tetracarboxylic dianhydride; 3,3'4,4'-diphenyl tetracarboxylic dianhydride; 1,2,5,6-naphthalene tetracarboxylic dianhydride; 2,2',3,3'-diphenyl tetracarboxylic dianhydride; 2,2-bis(3,4-dicarboxyphenyl)propane dianhydride; perylene-3,4,9,10-tetracarboxylic dianhydride; 4,4'-oxydiphthalic dianhydride; thiophene-2,3,5,6-tetracarboxylic dianhydride; naphthalene-1,2,4,5-tetracarboxylic dianhydride; naphthalene-1,4,5,8-tetracarboxylic dianhydride; 2,2',3,3'-benzophenone tetracarboxylic dianhydride; decahydronaphthalene-1,4,5,8-tetracarboxylic dianhydride; 4,8-dimethyl-1,2,3,5,6,7-hexahydronaphthalene-1,2,5,6-tetracarboxylic dianhydride; 2,6-dichloronaphthalene-1,4,5,8-tetracarboxylic dianhydride; 2,7-dichloronaphthalene-1,4,5,8-tetracarboxylic dianhydride; 2,3,6,7-tetrachloronaphthalene-1,4,5,8-tetracarboxylic dianhydride; phenanthrene-1,8,9,10-tetracarboxylic dianhydride; pyrazine-2,3,5,6-tetracarboxylic dianhydride; cyclopentane-1,2,3,4-butane tetracarboxylic dianhydride; pyrrolidine-2,3,4,5-tetracarboxylic dianhydride; pyrazine-2,3,5,6-tetracarboxylic dianhydride; 2,2-bis(2,3-dicarboxyphenyl)propane dianhydride; 1,1-bis(2,3-dicarboxyphenyl)ethane dianhydride; 1,1-bis(3,4-dicarboxyphenyl)ethane dianhydride; bis(2,3-dicarboxyphenyl)methane dianhydride; bis(3,4-dicarboxyphenyl)sulfone dianhydride; benzene 1,2,3,4-tetracarboxylic dianhydride; bis(3,4-dicarboxyphenyl)sulfide dianhydride; azobenzene tetracarboxylic dianhydride; 2,3,4,5-tetrahydrofuran tetracarboxylic dianhydride; p-phenylene bis(trimellitate) dianhydride; 1,2-ethylene bis(trimellitate) dianhydride; 2,2-propane bis(p-phenylenetrimellitate) dianhydride; 4,4'-(p-phenylene bis(phenylimino) carbonyl diphthalic) dianhydride; 4,4'-diphenylmethane bis(trimellitamide) dianhydride and mixtures thereof. As is well known, corresponding acids, esters, diacid diesters, or dihaloformyl diesters of the dianhydrides may also be used in the preparation of the oligomers cited herein.

The DASA end-cap of the present invention has the most general formula:

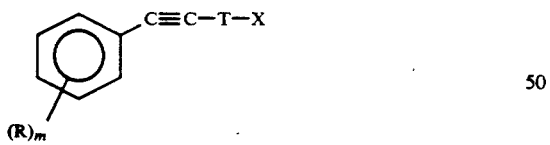

wherein m=0 to 5, T is an aromatic diradical selected from the group of preferred Q groups described above, and may be singly or multi substituted with R groups, where R is is independently selected from the group consisting of halogen (such as fluorine), $C_1$-$C_4$ alkyl, alkoxy, aryloxy, haloaryl, haloakyl, haloacyl, aryl, acyl and others, and X is a linking group to the oligomer backbone selected from the group consisting of $NH_2$, CHO, isocyanate, anhydride, carboxylic acid, ester, acyl halides, or any other group that would react with either a primary amine, anhydride, amic acid, or amic ester, to form a stable covalent linkage to the oligomer backbone.

Some typical DASA end-caps of the present invention include:

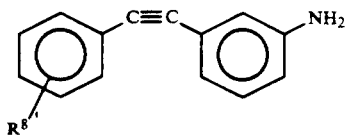

$R^8$ = H, $CF_3$, F

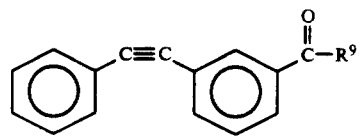

$R^9$ = OH, F, Cl, Br, I, alkoxy, aryloxy,

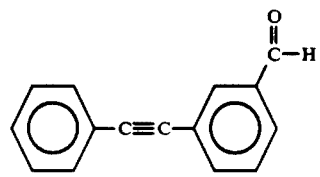

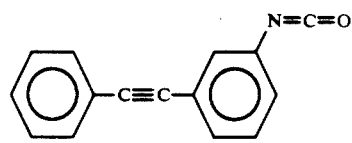

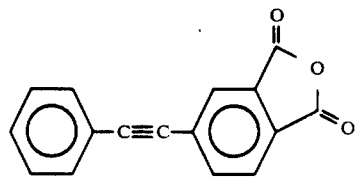

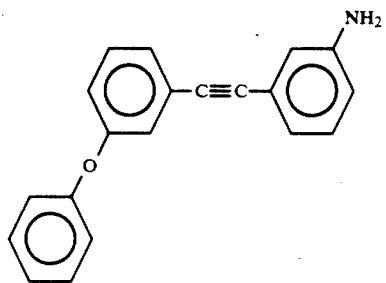

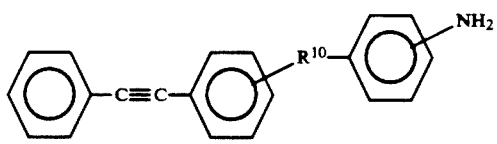

$R^{10}$ = —O—, —S—, —$\overset{\overset{O}{\|}}{C}$—, —$SO_2$—,

—$C(CF_3)_2$—, —$C(CH_3)_2$—

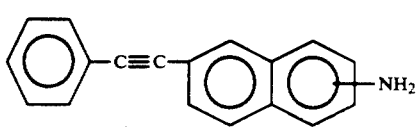

Preparation of the DASA-capped polyimide, polyamic acid, polyamic ester, or polyisoimide oligomers The DASA-capped oligomers are prepared by co-reacting stoichiometric equivalents of one or more of the diamines described herein with one or more of the above tetracarboxylic acid dianhydrides and at least one of the DASA end cap reagents described above in a suitable inert organic solvent.

It is understood that common derivatives of these tetracarboxylic acid dianhydrides which react with the aromatic diamines in a similar fashion may also be used. Such common derivatives of the dianhydrides would include, but are not limited to the tetracids, tetresters, diester-diacids, and dihaloformyl diesters.

The molecular weight of the oligomer is controlled by the stoichiometry. Preferably, the DASA end cap reagent should be present in an amount sufficient to completely end-cap the oligomer depending upon its molecular weight. It is thus essential that the total chemical equivalents of primary amine (i.e. diamine) and DASA end cap reagent equal the total chemical equivalents of anhydride (i.e. dianhydride) in the case where the DASA end cap reagent reacts with the anhydride functionality (e.g. 3-phenylethynylaniline). Otherwise, it is essential that the total chemical equivalents of primary amine (i.e. diamine) equal the total chemical equivalents of anhydride (i.e. dianhydride) and DASA end cap reagent in the case where the DASA end cap reagent reacts with the amine functionality (e.g. 3-phenylethynyl benzaldehyde).

Reaction conditions used for the preparation of the oligomers will depend not only upon the diamine used, but more particularly on the tetracarboxylic acid compound used and on the nature and reactivity of the DASA end cap reagent.

It will also depend upon the solvent selected and the percentage and molecular weight of the oligomer desired in the final solution. Some of the preferred methods of preparing the polyamic acid or polyamic ester oligomers are by reaction of diamines with either dianhydrides or common derivatives thereof, for example diester diacids derived from the lower alcohols. As is well known, these reactions are carried out under anhydrous conditions preferably using pure monomers and dry solvents.

The solvents used should dissolve at least one of the reactants, preferably both the dianhydride and the diamine. It is also preferred that the solvent should maintain the polyamic acid, polyamic ester, polyisoimide, or polyimide oligomer in solution.

Suitable solvents include, for example, N,N-dimethylformamide, N,N-dimethylacetamide, tetrahydrofuran (THF), dimethyl sulfoxide, 1-methyl-2-pyrrolidinone, tetramethylurea, m-cresol, and the like. These solvents can be used alone or in combination with other solvents such as benzene, benzonitrile, dioxane, xylene, toluene, and cyclohexane.

The diamine-dianhydride reaction is relatively rapid at low temperatures. It is typically carried out by first reacting the dianhydride and diamine in a suitable dry solvent, while applying external cooling and maintaining the temperature at about 10°-60° C.; then the monofunctional DASA end cap reagent is added while maintaining the temperature at 10°-60° C. for 1-6 hours to form the comparatively low molecular weight, soluble DASA-capped polyamic acid or polyamic ester oligomer. If pyromellitic dianhydride is used, a somewhat higher temperature may be required to dissolve the dianhydride (preferably below 75° C.).

After the end-capping reaction has been completed the product (polyamic acid oligomer) can then be cyclized by thermal or chemical dehydration to form the DASA-capped polyimides or polyisoimides.

The polyimide is obtained by heating the intermediate at temperatures up to about 300° C. or by treating the intermediate with chemical cyclizing agents at temperatures of about 100° C. or lower. Typical cyclizing agents include a dehydrating agent (e.g. acetic anhydride) in combination with a basic catalyst (e.g. pyridine) or a carbodiimide (e.g. dicyclohexylcarbodiimide). A combination of chemical and thermal cyclization may be used.

Thermal dehydration of the polyamic acid intermediate with the azeotropic removal of water results in the production of a normal polyimide species.

Chemical dehydration, on the other hand, employing such dehydrating agents as trifluoracetic anhydride, or N,N'-dicyclohexylcarbodiimide at relatively low temperature produces substantial amounts of the isoimide species. Those skilled in the art recognize that in the chemical dehydration of amic acids, there is tendency for imide groups to be formed and interspersed randomly with the isoimide groups of the oligomer. Therefore it is understood that after chemical dehydration of polyamic acids, the formation of both the corresponding isoimide and/or isoimideimide containing oligomers may be present.

The preferred procedure for the preparation of the DASA-capped polyamic acid, polyimide, or polyisoimide oligomer is as follows:

The appropriate dianhydride is charged to a reaction vessel and slurried (or dissolved) in the chosen solvent. The slurry (or solution) is warmed to 40°-45° C. and a solution of the appropriate diamine (the molar ratio of dianhydride to diamine is adjusted so as to give the desired oligomer length) is added over a 30 minute period. A solution of the capping agent is then added over a 15 minute period and the temperature of this reaction mixture is maintained at 40°-45° C. for 1 to 6 hours or more, preferably for 1 to 2 hours.

The order of addition of the diamine, dianhydride, and DASA end cap reagent will depend not only on the tetracarboxylic acid compound but more particularly on the functionality and reactivity of the DASA end cap reagent. In the case of a DASA end cap reagent that possesses functionality such that it reacts with an anhydride the preferred order of addition is that described above.

Otherwise, when the DASA end cap reagent possesses functionality such that it reacts with a primary amine the order of addition is reversed. That is, the diamine is charged to the vessel and the dianhydride is added to the diamine.

At this point the polyamic acid oligomer can be treated in three preferred ways:

A) the polyamic acid oligomer can be cooled to room temperature and used in this form where dehydration to the imide occurs during the solvent-removal and/or molding process;

B) the polyamic acid oligomer can be thermally dehydrated in solution to the polyimide oligomer which can be recovered by precipitation of the polyimide solution into water;

C) the polyamic acid oligomer can be cooled to 0°-20° C. and chemically dehydrated by the addition of 1,3-dicyclohexylcarbodiimide. The product polyisomide oligomer is recovered by first filtering to remove the dicyclohexylurea by-product, followed by precipitation of the oligomer in an appropriate non-solvent.

Alternatively, it may be preferred under certain circumstances to prepare poly(amic acid-imide) oligomers which possess a predetermined ratio of amic acid to imide. These poly(amic acid-imide) oligomers are prepared as described above except that the thermal dehydration is not carried to completion. Also, it may be preferred under certain circumstances to prepare poly(amic acid-isoimide) oligomers which possess a predetermined ratio of amic acid to isoimide. These poly(amic acid-isoimide) oligomers are prepared as described above except that less than a stoichiometric equivalent of a chemical dehydrating agent, such as 1,3-dicyclohexylcarbodiimide is employed.

In another preferred procedure it is desirable to prepare the DASA-capped polyamic ester oligomers. The polyamic ester oligomers are prepared as described above in the preferred procedure for the polyamic acid oligomers except that the common derivatives of the dianhydrides such as the tetraesters, the diester-diacids, and the dihaloformyl-diesters are used instead of the dianhydrides. The polyamic ester oligomers can be thermally cyclized to the polyimide oligomers with the evolution of alcohol.

In yet another preferred method the novel polyimides described herein may also be prepared and processed through the use of monomeric mixtures as is well known to those skilled in the art (see W. B. Alston, "Replacement of MDA with more Oxidatively Stable Diamines in PMR Polyimides", in *High Temperature Polymer Matrix Composites*, T. T. Serafini, Ed., Noyes Data Corp., Park Ridge, N.J. 1987, p. 186). For example, the dianhydride is added to an alcohol such as methanol and the solution is brought to reflux to form the diester-diacid of the dianhydride

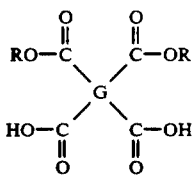

wherein when the alcohol is methanol, R is methyl. Alternatively, R may also be ethyl or any other hydrocarbon radical derived from the lower alcohols.

The diester-diacid of the dianhydride is usually soluble in the alcohol. The desired diamine and the DASA end cap reagent would then also be added to the alcohol solution in the appropriate quantities. This solution is a monomeric mixture which can be very useful from a processing standpoint due to its low viscosity at high solids relative to polymeric solutions. The polyimide is obtained during the processing procedure which involves heating the monomeric mixture in stages under predetermined processing conditions up to temperatures at or near 300° C. Further heating results in the cured polyimide.

Various other additives known to the skilled practitioner may also be incorporated in the compositions such as thickeners, plasticizers, inert fillers, or reinforcing fibers. Inert fillers may be in the form of powders, spheres (hollow or solid) flakes or whiskers. These may be metallic fillers such as nickel or silver, inorganic fillers such as glass, silica, alumina, silicon carbide, graphite or carbon black, or organic fillers such as Teflon ®. Reinforcing fibers may be in the form of short or long fibers, fiber mats, woven cloth, or continuous fibers. The latter typically being in the form of a tow of fibers containing several thousand filaments. These reinforcing fibers may be metallic fibers such as steel, nickel, or tungsten, or inorganic fibers such as carbon, glass, silicon carbide, or alumina, or organic fibers such as polyethylene, aramid (e.g. Kevlar ®, from Dupont), polybenzimidazole, or aromatic polyester (e.g. Vectran ® from Hoechst-Celanese).

These novel polyimides are useful as composite matrix resins. Prepegs can be prepared by dipping a tow of continuous reinforcing fibers into a solution of the resin (in monomeric or polymeric form), and then winding this tow onto a drum to form a unidirectional prepreg sheet of length equal to the circumference of the drum. Other prepregging methods well known to those skilled in the art, such as hot melt methods, could also be used. The solvent is then evaporated from the prepreg on the drum or in an oven. In some cases imidization and solvent removal may take place simultaneously. The partially or completely dried prepreg sheet is then cut into smaller pieces which are stacked into the desired configuration and consolidated into a laminate by the application of heat and pressure. The lamination process also serves to cure the resin. Typically the laminate is consolidated (fused and made void free) at a temperature below which cure is rapid. Once consolidated the temperature is raised to effect the cure. After lamination, the part is often post-cured free-standing at a still higher temperature in an oven.

These novel polyimide resins are also useful as high temperature adhesives. Typically the resin is applied to either or both adhered surfaces as a glass-cloth prepreg, a resin solution (in monomeric or polymeric form), or a resin film. The assembly is consolidated and cured under heat and pressure in a manner similar to that used to form composites.

Numerous uses exist for these resins in electronics. For example, they can be applied from solution to form planarizing or dielectric layers on silicon wafers, or can be used to encapsulate electronic devices. The solution is dried and cured to form a thermo-oxidatively stable polyimide film.

A specific electronic application of the present invention relates to a method of forming multilevel metallurgy on a substrate having an integrated circuit device, comprising:

(a) applying a coating composition to the surface of said substrate comprising the integrated circuit device thereby filling and substantially planarizing the substrate surface, using a composition containing DASA end-capped polyimide or polyisoimide oligomers or precursors thereof, (b) curing the composition to form a three dimensional imidized layer thereof, (c) forming via openings in the imidized layer extending to conductive portions of the integrated circuit device, and (d) forming a conductive pattern on the imidized layer and the via openings to at least one of the underlying conductive portions of the integrated circuit device.

The present invention further relates to a method for forming dielectrically isolated island regions in a semiconductor substrate comprising:

(a) forming in said substrate a recess trench pattern defining a plurality of isolated island regions, (b) filling said trenches with a composition containing as a component polyisoimide or polyimide oligomers end-capped with DASA, or precursors thereof, (c) curing said composition in situ in the trenches to form an imidized three dimensional dielectric polyimide therein.

These novel polyimides and polyisoimides can be used as molding compounds either with or without fillers (e.g. teflon or graphite powder), reinforcing fibers, or other useful additives well known to those skilled in the art. The molding compounds are used to form cured molded parts by suitable application of heat and pressure. Various molding techniques well known to those skilled in the art can be used, such as injection molding, compression molding, resin transfer molding, etc.

In all of these applications the high cure temperature of these materials is very important. It allows adequate processing time at the elevated temperatures required to melt polyimides with high fusion temperatures in the uncured state. When the polyimide can be heated to high temperatures prior to cure, the molten resin has adequate time and low enough viscosity to consolidate well (composites and molding compounds), wet out adherends (adhesives), or thoroughly wet, coat and planarize electronic devices.

This invention also relates to a process for the preparation of 3-phenylethynylaniline. Although sulfide salts have been used to reduce the nitro group, the reduction has never been carried out successfully in the presence of a potentially reducible acetylene moiety. Accordingly, this process provides for selective nitro group reduction. The reduction can also be carried out selectively in the presence of a terminal acetylene.

The following examples will more fully illustrate the embodiments of this invention. In the examples, all parts and percentages are given by weight and all temperatures are in degrees Celsius, unless otherwise noted. Inherent viscosities were determined on 0.5 g/dl (grams per deciliter) solutions at 25° C. in 1-methyl-2-pyrrolidinone.

EXAMPLE 1

This example illustrates the preparation of an n=3 oligomer of this invention.

To a slurry of benzophenone tetracarboxylic dianhydride (BTDA) (10.0 g, 0.0306 mole) in 50 ml tetrahydrofuran held at 40°–45° C. was added a solution of bisaniline P (7.96 g, 0.023 mole) in 100 ml tetrahydrofuran over a one hour period. This was followed by the addition of 3-phenylethynylaniline (PEA) (3.03 g, 0.0153 mole) dissolved in 20 ml tetrahydrofuran. The reaction mixture was stirred for an additional hour at 40°–45° C. The flask was cooled to 10° C. and 1,3-dicyclohexylcarbodiimide (12.9 g, 0.063 mole) in 20 ml tetrahydrofuran was added to effect dehydration. After standing for 16 hours at 5° C. the by-product urea was removed by filtration. The oligomer was recovered by precipitation of the tetrahydrofuran lacquer into 2-propanol. The infrared spectrum exhibited a strong isoimide absorption with very little imide or amic acid. The yellow powder contained 1% volatile material and had an inherent viscosity of 0.16 dl/g measured at 0.5 g/dl concentration in N-methylpyrrolidinone at 25° C. A glass transition temperature of 295° C. was observed for this material after cure by Differential Scanning Calorimetry.

EXAMPLE 2

This example illustrates the preparation of another n=3 oligomer of this invention.

To a slurry of s-biphenyl dianhydride (10.0 g, 0.034 mole) in 50 ml tetrahydrofuran held at 40°–45° C. was added a solution of bisaniline M (8.8 g, 0.025 mole) in 100 ml tetrahydrofuran over a one hour period. This was followed by the addition of 3-phenylethynylaniline (3.3 g, 0.017 mole) dissolved in 20 ml tetrahydrofuran. The reaction mixture was stirred for an additional hour at 40°–45° C. The flask was cooled to 10° C. and 1,3-dicyclohexylcarbodiimide (14.3 g, 0.069 mole) in 25 ml tetrahydrofuran was added to effect dehydration. After standing for 16 hours at 5° C. the by-product urea was removed by filtration. The oligomer was recovered by precipitation of the tetrahydrofuran lacquer into 2-propanol. The infrared spectrum exhibited a strong isoimide absorption with very little imide or amic acid. The yellow powder oligomer contained 1% volatile material and had an inherent viscosity of 0.12 dl/g at 0.5 g/dl concentration in N-methylpyrrolidinone at 25° C. A glass transition temperature of 254° C. was observed for this material after cure by Differential Scanning Calorimetry.

EXAMPLE 3

This example illustrates the preparation of another n=3 oligomer of the present invention.

To a slurry of benzophenone tetracarboxylic dianhydride (10.0 g, 0.0306 mole) in 80 ml tetrahydrofuran held at 40°–45° C. was added a solution of bisaniline M (8.0 g, 0.023 mole) in 80 ml tetrahydrofuran over a one hour period. This was followed by the addition of 3-phenylethynylaniline (3.0 g, 0.015 mole) dissolved in 20 ml tetrahydrofuran. The reaction mixture was stirred for an additional hour at 40°–45° C. The flask was cooled to 10° C. and 1,3-dicyclohexylcarbodiimide (12.9 g, 0.063 mole) in 20 ml tetrahydrofuran was added to effect dehydration. After standing for 16 hours at 5° C. the by-product urea was removed by filtration. The oligomer was recovered by precipitation of the tetrahydrofuran lacquer into 2-propanol. The infrared spectrum exhibited a strong isoimide absorption with very little imide or amic acid. The yellow powder oligomer contained 1% volatile material and had an inherent viscosity of 0.16 dl/g measured at 0.5 g/dl concentration in N-methylpyrrolidinone at 25° C. A glass transition temperature of 252° C. was observed for this material after cure by Differential Scanning Calorimetry.

EXAMPLE 4

This example illustrates the preparation of an n=1 oligomer of this invention.

To a slurry of 5,5'-[2,2,2-trifluoro-1-(trifluoromethyl-)ethylidene]bis-1,3-isobenzofurandione (15.0 g, 0.033 mole) in 75 ml tetrahydrofuran held at 40°–45° C. was added a solution of a 1,4-phenylenediamine (1.8 g, 0.0165 mole) in 25 ml tetrahydrofuran over a 20 minute period. This was followed by the addition of 3-phenylethynylaniline (6.5 g, 0.033 mole) dissolved in 25 ml tetrahydrofuran. The reaction mixture was stirred for an additional hour at 40°–45° C. The flask was cooled to 10° C. and 1,3-dicyclohexylcarbodiimide (14.0 g, 0.068 mole) in 25 ml tetrahydrofuran was added to effect dehydration. After standing for 16 hours at 5° C. the by-product urea was removed by filtration. The oligomer was recovered by precipitation of the tetrahydrofuran lacquer into 2-propanol. The infrared spectrum exhibited a strong isoimide absorption with very little imide or amic acid. The yellow powder contained 2% volatile material and had an inherent viscosity of 0.12 dl/g measured at 0.5 g/dl concentration in N-methylpyrrolidinone at 25° C. A glass transition temperature of 388° C. was observed for this material after cure by dynamic mechanical analysis.

EXAMPLE 5

This example illustrates the preparation of an n=5 oligomer of this invention.

To a slurry of 5,5'-[2,2,2-trifluoro-1(trifluoromethyl)ethylidene]bis-1,3-isobenzofurandione (25.0 g, 0.055 mole) in 100 ml tetrahydrofuran held at 40°-45° C. was added a solution of 1,4-phenylenediamine (4.96 g, 0.046 mole) in 100 ml tetrahydrofuran over a one hour period. This was followed by the addition of 3-phenylethynylaniline (3.6 g, 0.018 mole) dissolved in 30 ml tetrahydrofuran. The reaction mixture was stirred for an additional hour at 40°-45° C. The flask was cooled to 10° C. and 1,3-dicyclohexylcarbodiimide (23.4 g, 0.114 mole) in 30 ml tetrahydrofuran was added to effect dehydration. After standing for 16 hours at 5° C. the by-product urea was removed by filtration. The oligomer was recovered by precipitation of the tetrahydrofuran lacquer into 2-propanol. The infrared spectrum exhibited a strong isoimide absorption with very little imide or amic acid. The yellow powder contained 2% volatile material and had an inherent viscosity of 0.16 dl/g measured at 0.5 g/dl concentration in N-methylpyrrolidinone at 25° C. A glass transition temperature of 379° C. was observed for this material after cure by dynamic mechanical analysis.

EXAMPLE 6

This example illustrates the preparation of an n=10 oligomer of this invention.

To a slurry of 4,4'-oxydiphthalic dianhydride (31.65 g, 0.10 mole) in 100 ml N-methylpyrrolidone held at 40°-45° C. was added a solution of 4,4'-oxydianiline (18.46 g, 0.091 mole) in 75 ml N-methylpyrrolidone over a 35 min. period. This was followed by the addition of 3-[3-(trifluoromethyl)phenylethynyl]aniline (4.75 g, 0.018 moles) dissolved in 25 ml of N-methylpyrrolidone. The reaction mixture was stirred for an additional hour at 40°-45° C. The amic acid lacquer was stored below room temperature in a sealed container. The cured polyimide derived from this amic acid had a cured glass transition temperature of 260° C. as determined by dynamic mechanical analysis.

EXAMPLE 7

This example illustrates the preparation of another n=5 oligomer of the present invention.

To a slurry of 4,4'-oxydiphthalic dianhydride (20.0 g, 0.063 mole) in 40 ml N-methylpyrrolidinone held at 40°-45° C. was added a solution of 1,4-phenylenediamine (5.7 g, 0.052 mole) in 60 ml N-methylpyrrolidinone over a one hour period. This was followed by the addition of 3-phenylethynyl aniline (4.1 g, 0.021 mole) dissolved in 30 ml N-methylpyrrolidinone. The reaction mixture was stirred for an additional hour at 40°-45° C. The flask was cooled to 10° C. and 1,3-dicyclohexylcarbodiimide (27.0 g, 0.13 mole) in 20 ml N-methylpyrrolidinone was added to effect dehydration. After standing for 16 hours at 5° C. the by-product urea was removed by filtration. The oligomer was recovered by precipitation of the N-methylpyrrolidinone lacquer into 2-propanol. The infrared spectrum exhibited a strong isoimide absorption with very little imide or amic acid. The yellow powder contained 3% volatile material and had an inherent viscosity of 0.20 dl/g measured at 0.5 g/dl concentration in N-methylpyrrolidinone at 25° C.

EXAMPLE 8

This example illustrates the preparation of another n=10 oligomer according to the present invention.

To a slurry of 3,4,3'4'-biphenyltetracarboxylic dianhydride (44.26 g, 0.15 mole) in 120 ml N-methylpyrrolidone held at 40°-45° C. was added a solution of 1,4-phenylenediamine (14.38 g, 0.133 mole) and 1,3-bis(3-aminophenoxy) benzene (0.88 g, 0.003 mole) in 100 ml N-methylpyrrolidone over a 47 min. period. This was followed by the addition of 3-[3-(trifluoromethyl)phenylethynyl]aniline (7.13 g, 0.027 moles) dissolved in 20 ml of N-methylpyrrolidone. The reaction mixture was stirred for an additional hour at 40°-45° C. The amic acid lacquer was stored below room temperature in a sealed container. The cured polyimide derived from this amic acid had a cured glass transition temperature of 390° C. as determined by dynamic mechanical analysis.

EXAMPLE 9

This example illustrates the preparation of another n=10 oligomer of this invention.

To a slurry of 5,5'-[2,2,2-trifluoro-1(trifluoromethyl)ethylidene]bis-1,3-isobenzofurandione (45.37 g, 0.10 mole) in 100 ml N-methylpyrrolidone held at 40°-45° C. was added a solution of 1,4-phenylenediamine (9.84 g, 0.091 mole) in 100 ml N-methylpyrrolidone over a 38 min. period. This was followed by the addition of 3-[3-(trifluoromethyl) phenylethynyl]aniline (4.75 g, 0.018 moles) dissolved in 20 ml of N-methylpyrrolidone. The reaction mixture was stirred for an additional hour at 40°-45° C. The amic acid lacquer was stored below room temperature in a sealed container. The cured polyimide derived from this amic acid had a glass transition temperature of 316° C. as determined by dynamic mechanical analysis.

EXAMPLE 10

This example illustrates the preparation of another n=10 oligomer of the present invention.

To a slurry of 3,4,3',4'-benzophenone tetracarboxcyclic dianhydride (32.81 g, 0.10 mole) in 100 ml N-methylpyrrolidone held at 40°-45° C. was added a solution of 4,4'-[1,4-phenylenebis(1-methylethylidene)]bis(benzenamine) (31.57 g, 0.091 mole) in 100 ml N-methylpyrrolidone and 35 ml of tetrahydrofuran over a 80 min. period. This was followed by the addition of 3-[3-(trifluoromethyl)phenylethynyl]aniline (4.75 g, 0.018 moles) dissolved in 20 ml of N-methylpyrrolidone. The reaction mixture was stirred for an additional hour at 40°-45° C. The amic acid lacquer was stored below room temperature in a sealed container. The cured polyimide derived from this amic acid had a glass transition temperature of 270° C. as determined by dynamic mechanical analysis.

EXAMPLE 11

This example illustrates the preparation of another n=10 oligomer of this invention.

To a slurry of 3,4,3',4'-biphenyltetracarboxylic dianhydride (14.75 g, 0.050 mole) in 40 ml N-methylpyrrolidone held at 40°–45° C. was added a solution of 1,3-phenylenediamine (4.9 g, 0.0454 mole) in 30 ml N-methylpyrrolidone over a 40 min. period. This was followed by the addition of 3-[3-(trifluoromethyl)-phenylethynyl]aniline (2.38 g, 0.0091 moles) dissolved in 10 ml of N-methylpyrrolidone. The reaction mixture was stirred for an additional hour at 40°–45° C. The amic acid lacquer was stored below room temperature in a sealed container. The cured polyimide derived from this amic acid had a glass transition temperature of 329° C. as determined by dynamic mechanical analysis.

EXAMPLE 12

This example illustrates the preparation of an n=30 oligomer according to this invention.

To a slurry of 5,5'-[2,2,2-trifluoro-1(trifluoromethyl)ethylidene]bis-1,3-isobenzofurandione (226.85 g, 0.500 mole) in 695 ml N-methylpyrrolidone held at 40°–45° C. was added a solution of 1,4-phenylenediamine (52.34 g, 0.484 mole) in 695 ml N-methylpyrrolidone over a 1 hour period. This was followed by the addition of 3-[3-trifluoromethyl)phenylethynyl]aniline (8.51 g, 0.0322 moles) dissolved in 50 ml of N-methylpyrrolidone. The reaction mixture was stirred for an additional hour at 40°–45° C. The amic acid lacquer was stored below room temperature in a sealed container. The cured polyimide derived from this amic acid had a glass transition temperature of 316° C. as determined by dynamic mechanical analysis.

EXAMPLE 13

This example illustrates the preparation of another n=3 oligomer of the present invention.

To a solution of 1,3-bis(3-aminophenoxy)benzene (11.80 g, 0.040 mole) in 100 ml tetrahydrofuran held at 40°–45° C. was added 3,4,3',4'-benzophenone tetracarboxcyclic dianhydride (9.84 g, 0.030 mole) over a 30 min. period. This was followed by the addition of 3-phenylethynyl benzaldehyde (4.19 g, 0.020 mole). The reaction mixture was stirred for an additional hour at 40°–45° C. The flask was cooled to 5° C. and 1,3-dicyclohexylcarbodiimide (16.97 g, 0.082 mole) in 25 ml of tetrahydrofuran was added to effect dehydration. After standing for 16 hours at 5° C. the by-product urea was removed by filtration. The oligomer was recovered by precipitation of the tetrahydrofuran lacquer into 2-propanol. The infrared spectrum exhibited a strong isoimide absorption with very little imide or amic acid. The yellow powder contained 6.7% volatile material and had an inherent viscosity of 0.28 dl/g measured at 0.5 g/dl concentration in N-methylpyrrolidone at 25° C.

EXAMPLE 14

This example illustrates the preparation of another n=3 oligomer according to the present invention.

To a slurry of benzophenone tetracarboxylic dianhydride (16.4 g, 0.05 mole) in 75 ml tetrahydrofuran held at 40°–45° C. was added a solution of 1,3-bis(3-aminophenoxy) benzene 11.0 g 0.0375 mole) in 50 ml tetrahydrofuran over a thirty minute period. This was followed by the addition of 3-(4-fluorophenylethynyl) aniline (4F-PEA) (5.3 g, 0.025 mole) dissolved in 25 ml tetrahydrofuran. The reaction mixture was stirred for an additional hour at 40°–45° C. The flask was cooled to 10° C. and 1,3-dicyclohexyl carbodiimide (21.2 g, 0.10 mole) in 25 ml tetrahydrofuran was added to effect dehydration.

After standing for 16 hours at 5° C. the by-product urea was removed by filtration. The oligomer was recovered by precipitation of the tetrahydrofuran lacquer into 2-propanol. The infrared spectrum exhibited a strong isoimide absorption with very little imide or amic acid. The yellow powder contained 2% volatile material and had an inherent viscosity of 0.22 dl/g measured at 0.5 g/dl concentration in N-methylpyrrolidinone at 25° C. A glass transition temperature of 225° C. was observed for this material after cure by differential scanning calorimetry.

EXAMPLE 15

This example illustrates the preparation of an n=15 oligomer with an uncured Tg less than 135° C. according to the present invention.

To a solution of 4,4'-oxydiphthalic dianhydride (15.8 g, 0.050 mole) in 100 ml N-methylpyrrolidinone held at 70°–80° C. is added a solution of a polysiloxane diamine, TEGO ® OF 2025 (M.Wt.=2351.54 determined by NH$_2$ titration) available from TH. Goldschmidt AG, (55.0 g, 0.0234 mole) in 75 ml N-methylpyrrolidinone over a thirty minute period. The solution is held at 70°–80° C. for an additional thirty minutes after which is added a solution of 1,3-bis(3-aminophenoxy)-benzene (6.90, 0.0234 mole) in 30 ml N-methylpyrrolidinone over a fifteen minute period. This is followed by the addition of 3-[3-(trifluoromethyl)phenylethynyl]aniline (1.66 g, 0.0063 mole) dissolved in 30 ml N-methylpyrrolidinone while maintaining the temperature at 70°–80° C. At this point 75 ml toluene is added and the temperature is raised to 150°–170° C. to azeotropically remove the water produced during the solution imidization. When the imidization is complete the bulk of the toluene is removed by distillation. The polyimide oligomer solution is cooled to room temperature. The oligomer is recovered as a tan powder by precipitation of the N-methylpyrrolidinone lacquer into 2-propanol.

EXAMPLE 16

This example illustrates the preparation of 3-phenylethynylaniline according to the present invention.

A multi-necked round bottom flask fitted with a mechanical stirrer, reflux condenser, and thermometer was flushed and maintained under a positive pressure of nitrogen. The flask was charged with 202 g (1.0 mol) of 3-bromonitrobenzene, 1 liter of dried, degassed triethylamine, 107.6 g (1.05 mol) of phenylacetylene, 0.80 g (1.01 mmol) of bis-triphenylphosphine palladium II chloride, 3.7 g (14.1 mmol) of triphenylphosphine, and 0.15 g (0.79 mmol) of cuprous iodide. The system is brought to mild reflux and maintained at that temperature overnight.

The following morning thin layer chromatography showed only a trace presence of 3-bromonitrobenzene. The reaction mixture was cooled to room temperature followed by the addition of 350 ml of ether. The triethylamine hydrobromide by-product (179 g, 98% of theory) was removed by filtration. The filtrate was concentrated on the rotary evaporator, to give 215.6 g (0.96 mol, 96.5%) of the phenylethynylnitrobenzene intermediate.

To a 5-liter multi-necked flask fitted with a mechanical stirrer, reflux condenser, and thermometer was charged 215.6 g (0.96 mol) of 3-phenylethynylnitrobenzene obtained as described above, 600.2 g (2.5 mol) of sodium sulfide nonahydrate, 2 liters of methanol, and 500 ml of distilled water. The system is brought to 70°

C. for 3 hours at which point the reduction is complete by thin layer chromatography. The reaction mixture is cooled to room temperature and the methanol removed by a rotary evaporator. The concentrate is added to a separatory funnel along with 1 liter of toluene. The toluene layer is separated and washed with distilled water until neutral to pH paper. Concentration of the toluene solution followed by vacuum distillation gave 131 g (0.68 mol, 71% yield) of 3-phenylethynylaniline.

EXAMPLE 17

This example illustrates the preparation of 3-[3-(trifluoromethyl)phenylethynyl]aniline according to the present invention. See Fenelli copending companion patent application, Ser. No. 07/631,132 filed on Dec. 20, 1990.

A multi-necked round bottom flask fitted with a mechanical stirrer, reflux condenser, and thermometer was flushed and maintained under positive pressure of nitrogen. The flask was charged with 100 g (0.44 mol) of 3-bromobenzotrifluoride, 300 ml of dried, degassed triethylamine, 51.5 g (0.44 mol) of 3-aminophenylacetylene, 0.35 g (0.44 mmol) of bis(triphenylphosphine) palladium (II) chloride, 1.6 g (6.09 mmol) of triphenylphosphine, and 0.1 g (0.52 mmol) of cuprous iodide. The system was brought to 65° and maintained at that temperature overnight.

The following morning (about 16 hours later) gas chromatography indicated no presence of 3-bromobenzotrifluoride. The mixture was cooled to room temperature followed by the addition of 200 ml ether. The triethylamine hydrobromide by-product (76 g, 95% of theory) was removed by filtration. Concentration of the filtrate followed by vacuum distillation gave 81 g (0.31 mol, 71% yield) of the purified product.

EXAMPLE 18

This example illustrates the preparation of 3-(4-fluorophenylethynyl)aniline according to the present invention. See Fenelli copending companion patent application, Ser. No. 07/631,132 filed on Dec. 20, 1990.

A multi-necked flask as described in Example 16 was charged with 50 g (0.28 mol) of p-bromofluorobenzene, 200 ml of dried, degassed, triethylamine, 35 g (0.30 mol) of 3-aminophenyl acetylene, 0.23 g (0.29 m mol) of bis(triphenylphosphine)palladium II chloride, 1.03 g (3.92) m mol of triphenylphosphine, and 0.1 g (0.52 m mol) of cuprous iodide. The system is brought to 65° C. and maintained at that temperature for 48 hours, at which point gas chromatography indicated an absence of p-bromofluorobenzene in the reaction mixture. The mixture was cooled to room temperature followed by the addition of 200 ml of toluene. The toluene/triethylamine solution was decanted off and concentrated on the rotary evaporator to give 57 g (0.27 mol, 95% yield) of the product as a bright yellow solid.

EXAMPLE 18A

This example illustrates the preparation of 3-(3-phenylethynylphenoxy)aniline (PEPA). A multi-necked flask as described in Example 16 was flushed and maintained under a positive pressure of nitrogen. The flask was charged with 50.0 g (0.19 mol) of 3-bromo-3'-aminodiphenyl ether, 400 ml of dry triethylamine, 40 ml of dry toluene, 23.2 g (0.22 mol) of phenylacetylene, 1.09 g (0.94 mmol) of tetrakis(triphenylphosphine)palladium (0), 0.49 g (1.87 mmol) of triphenylphosphine, and 0.1 g (0.52 mmol) of cuprous iodide. The reaction mixture was degassed with nitrogen and then heated at 75° C. for 20 hours at which point TLC (cyclohexane/ethyl acetate (3:1) on neutral alumina) showed the reaction to be complete. The product mixture was diluted with 200 ml of toluene and then cooled to room temperature. Removal of the triethylamine hydrobromide by-product followed by concentration under reduced pressure gave the crude product as a viscous brown oil.

The crude product was dissolved in 400 ml of dry benzene and then added to a multi-necked flask fitted with a mechanical stirrer, thermometer, rubber septum, and a reflux condenser to which a NaOH containing scrubber was connected. The stirred solution was then saturated with hydrogen chloride and the resulting hydrochloride salt was isolated by suction filtration (52.5 g, 0.16 mol, 86% yield).

The hydrochloride salt was suspended in 200 ml of distilled water with stirring followed by the addition of 25.6 g (0.16 mol at 25 w/v %) of aqueous sodium hydroxide. Extraction with toluene followed by drying over $Na_2SO_4$ and concentration gave 43.4 g (0.152 mol, 80% yield) of PEPA. Titration with 0.1N perchloric acid indicated a purity of 97.4%.

EXAMPLE 18B

This example illustrates the preparation of an n=1 amic acid oligomer prepared from 3,3'-4,4'-biphenyltetracarboxylic dianhydride (s-BPDA) and 1,4-phenylene diamine (p-PD) which is end-capped with PEPA.

To a stirred, heated (45° C.) slurry of 29.4 g (0.1 mol) of 3,3'-4,4'-biphenyltetracarboxylic dianhydride in 60 ml of NMP was added dropwise 5.41 g (0.05 mol) of freshly distilled 1,4-phenylene diamine in 40 ml of NMP. The resulting solution was stirred for one hour at 45° C. followed by the dropwise addition of 29.3 g (0.1 mol) of 3-(3-phenylethynylphenoxy)aniline in 20 ml of NMP. The product solution was then allowed to stir for one hour while cooling to room temperature.

Thermogravimetric analysis showed that the amic acid solution was 28.3% solids. The inherent viscosity, as determined with a 100 size Cannon-Fenske tube, was 0.17 dl/g at 0.5 g/dl concentration in N-methyl-pyrrolidone at 25° C.

EXAMPLE 19

Table 1 discloses some of the endcapped polyimides, polyisoimides and polyamic acids (n=10 except for 32 and 33, for which n=1) prepared by the procedure described above. In Table 1, oligomers 1-8, 10-14 and 20 were prepared as isoimides, and oligomers 9, 15-19 and 21-33 were prepared as amic acids. The cured and uncured Tgs for the oligomers using DSC and DMA values are also shown in Table 1.

The DMA value for the uncured Tg was measured by the onset of the drop in flexural modulus (E') using a glass cloth prepreg of the polyimide resin heated at a rate of 5° C./min in a Dupont 982 DMA in the horizontal mode. These prepregs were first dried and imidized as follows: 90° C. overnight, followed by 30 minutes at 300° C., both in forced air ovens.

The DSC value for the uncured Tg was taken as the inflection point by DSC (differential scanning colorimetry) conducted in a sealed pan heated at 10° C./min. Polyisoimides were first imidized by heating to 320° C. at 10° C./min in a sealed DSC pan. Polyamic acid solutions were dried and imidized by heating to 300° C. in 40 minutes and then holding at this temperature for 30 minutes.

The DMA value for the cured Tg was measured the same as the uncured Tg except that the imide was cured at 350° C. for 60 minutes, followed by 400° C. for 30 minutes, both in forced air ovens.

The DSC value for the cured Tg was measured similarly to the uncured Tg. The imide was cured in the DSC by heating to 350° C. at 10° C./min, then holding at 350° C. for 60 minutes, followed by further heating to 400° C. at 10° C./min and then holding for 30 minutes. Polyisoimides were not imidized prior to the cure cycle. Poly(amic acid) solutions were first dried and imidized by heating to 300° C. in 40 minutes, and then holding at this temperature for 30 minutes, in a forced air oven.

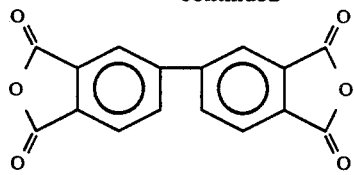

3,4,3'4'-biphenyltetracarboxylic dianhydride (s-BPDA)

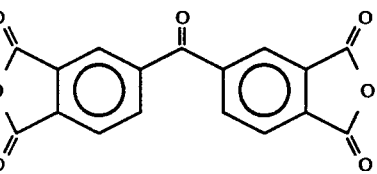

3,3',4,4'-benzophenone tetracarboxylic dianhydride (BTDA)

TABLE 1

| Dianhydride | Diamine | End Cap | Uncured Tg (°C.) DMA | Uncured Tg (°C.) DSC | Cured Tg (°C.) DMA | Cured Tg (°C.) DSC |
|---|---|---|---|---|---|---|
| 1. 6FDA | p-PD | 3-PEA | 267 | 272 | 343 | 352 |
| 2. 6FDA/s-BPDA 1:1 | p-PD | 3-PEA | 254 | 228 | 345 | 347 |
| 3. S-BPDA | 4,4'ODA | 3-PEA | 223 | 218 | 267 | — |
| 4. ODPA | 4,4'ODA | 3-PEA | 217 | 208 | 290 | 275 |
| 5. ODPA | p-PD/4,4'ODA 9:1 | 3-PEA | 216 | 208 | 285 | — |
| 6. ODPA | 4,4'ODA/p-PD 3:1 | 3-PEA | 221 | 220 | 303 | 276 |
| 7. BTDA | 4,4'ODA | 3-PEA | 245 | 229 | 298 | 295 |
| 8. ODPA | m-PD/APB 19:1 | 3-PEA | 213 | 218 | 302 | 314 |
| 9. PMDA | m-PD/APB 9:1 | 3-PEA | 296 | — | — | — |
| 10. ODPA | bis-P | 3-PEA | 215 | 221 | — | 273 |
| 11. ODPA | 4,4'ODA | 3-APA | — | 210 | — | — |
| 12. ODPA | p-PD/APB 9:1 | 3-PEA | — | — | — | — |
| 13. S-BPDA/ODPA 1:1 | p-PD/APB 9:1 | 3-PEA | 210 | — | 274 | — |
| 14. ODPA | 4,4'ODA | 3-CF$_3$-PEA | 206 | 211 | 266 | 292 |
| 15. S-BPDA | m-PD | 3-APA | — | — | 345 | — |
| 16. S-BPDA | p-PD | 3-APA | — | — | 392 | — |
| 17. S-BPDA/PMDA 1:1 | m-PD | 3-PEA | — | — | 335 | — |
| 18. S-BPDA/ODPA 1:1 | p-PD/4,4'ODA 3:1 | 3-PEA | 185 | — | 269 | — |
| 19. S-BPDA | p-PD | 3-PEA | 240 | — | 402 | — |
| 20. BTDA | bis-P | 3-PEA | 200 | — | 309 | 280 |
| 21. S-BPDA | m-PD | 3-PEA | 243 | — | 316 | — |
| 22. S-BPDA | m-PD/p-PD 1:1 | 3-PEA | 227 | — | 299 | — |
| 23. S-BPDA | p-PD/APB 19:1 | 3-APA | — | — | 316 | — |
| 24. S-BPDA | p-PD/m-PD 19:1 | 3-PEA | 265 | — | 325 | — |
| 25. S-BPDA | p-PD/APB 49:1 | 3-PEA | 264 | — | 390 | 391 |
| 26. S-BPDA | p-PD/3,3'DABP 19:1 | 3-PEA | 230 | — | 397 | — |
| 27. S-BPDA | p-PD/3,3'DDS 19:1 | 3-PEA | 244 | — | 385 | — |
| 28. S-BPDA | p-PD/3,4'ODA 19:1 | 3-PEA | 240 | — | 388 | — |
| 29. ODPA | 4,4'ODA | 3-CF$_3$-PEA | — | — | 260 | — |
| 30. 6FDA | p-PD | 3-CF$_3$-PEA | — | — | 316 | — |
| 31. BTDA | bis-P | 3-CF$_3$-PEA | — | — | — | — |
| 32. ODPA | 4,4'ODA | 3-PEA | 145 | — | — | — n = 1 |
| 33. S-BPDA | m-PD | 3-PEA | 165 | — | — | — n = 1 |

The following are the structural formulas of the reactants in Table 1.

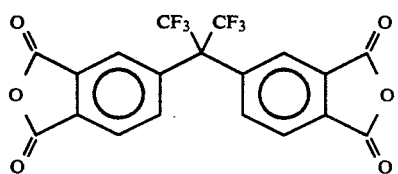

5,5'-[2,2,2-trifluoro-1-(trifluoromethyl)ethylidene]bis-1,3-isobenzofurandione (6FDA)

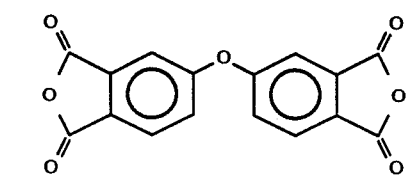

bis(3,4-dicarboxyphenyl)ether dianhydride (or) 4,4'-oxydiphthalic dianhydride (ODPA)

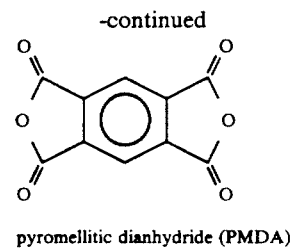

pyromellitic dianhydride (PMDA)

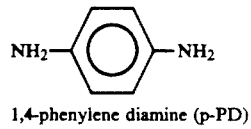

1,4-phenylene diamine (p-PD)

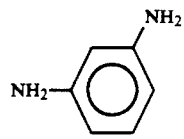

1,3-phenylenediamine (m-PD)

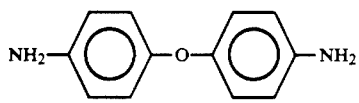

4,4'-oxydianiline(4,4'-ODA)

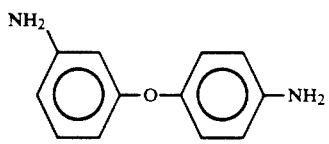

3,4'-oxydianiline (3,4'-ODA)

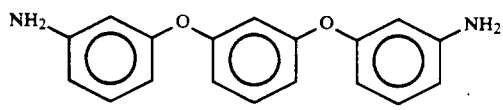

1,3-bis(3-aminophenoxy)benzene (APB)

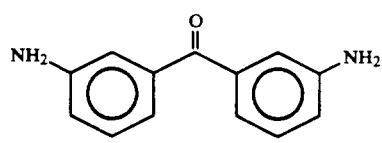

3,3'-diaminobenzophenone (3,3'-DABP)

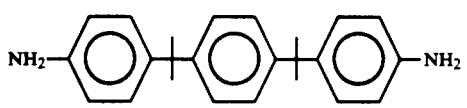

4,4'-[1,4-phenylenebis (1-methylethylidene)]bis(benzenamine) or bisaniline P (Bis-P)

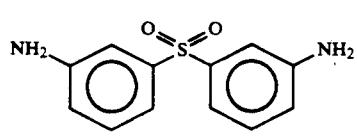

3,3'-diaminodiphenyl sulfone (3,3'-DDS)

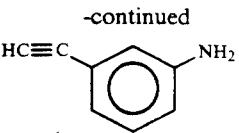

3-aminophenyl acetylene (3-APA)

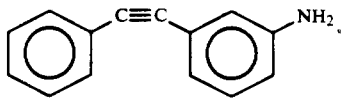

3-(phenylethynyl)benzenamine or 3-phenylethynylaniline (3-PEA)

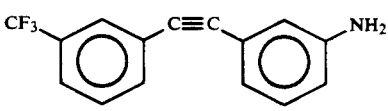

3-[3-(trifluoromethyl)Phenylethynyl]aniline (3-CF$_3$-PEA)

EXAMPLE 20

Table 2 lists the uncured Tg's of some of the polyimide oligomers synthesized as described in Examples 1-15. These uncured Tg's were obtained on the imidized material by differential scanning calorimetry as described in Example 19.

|            | Uncured Tg (°C.) |
|------------|------------------|
| Example 1  | 189              |
| Example 3  | 168              |
| Example 4  | 193              |
| Example 5  | 251              |
| Example 10 | 270              |
| Example 13 | 158              |
| Example 14 | 161              |

EXAMPLE 21

This is an example of the preparation of a composite prepreg. A polyamic acid resin solution was used to coat carbon fibers (Hercules AS4 12K). The resin was composed of 3,4,3',4' benzophenone tetracarboxylic dianhydride (BTDA), bisaniline P, and 3-phenylethynylaniline, with an oligomer length n=10. The solution, containing 28.4% resin by weight in N-methyl pyrrolidone (NMP), was transferred to a dip tank. The carbon fiber tow, containing 12,000 filaments, was dipped into the resin bath where it then passed over three circular bars immersed in the bath. After exiting the bath the impregnated tow was wrapped onto an 18" diameter, 30" long drum. After the entire drum was wound with fiber, the drum was heated to 70° C. and held there for four hours. This heating removed most of the solvent. At this stage the prepreg contained 23.4% volatiles (by weight) and was tacky and leathery. The prepeg was then cut parallel to the axis of the drum to produce a unidirectional prepreg sheet 30" wide and 56" long.

EXAMPLE 22

This is an example of the preparation of a composite laminate. From the prepreg prepared as described in Example 21, were cut eight 6"×6" sheets. These were stacked with all the fibers aligned, and then dried and imidized in a forced-air oven as follows:

30° C.→90° C. in 60 min, hold 16 hrs
90° C.→160° C. in 140 min, hold 3 hrs
160° C.→210° C. in 50 min. hold ½ hr
210° C.→230° C. in 20 min, hold 1 hr The dried and imidized prepreg contained 0.7% volatiles and 56% fiber, both by weight. It was placed in a 6"×6" closed mold precoated with release agent. The mold was placed in a vacuum press and a vacuum of 29" Hg applied. The laminate was consolidated at 200 psi and cured at 375° C. for 1½ hrs. The product was a 6"×6"×0.077" unidirectional composite laminate.

EXAMPLE 23

This is an example of the preparation of a molded part. Ten grams of a polyisoimide composed of 5,5'-[2,2,2-trifluoro-1-(trifluoromethyl) ethylidene]bis,-1,3-isobenzofurandione (6FDA), p-phenylene diamine, and 3-phenylethynylaniline, and with an oligomer length $n=5$ was dried and imidized in a forced air oven by heating to 160° C. in 30 minutes, holding at 160° C. for 3 hrs, heating to 265° C. at 1° C./min, and holding for 3 hrs. This resin was placed in a 3.25"×1" closed mold which had been precoated with release agent. The mold was placed in a vacuum press and a vacuum of 29" Hg applied. It was heated to 320° C. and then the vacuum was released. When the mold hit 340° C., pressure was applied at a rate of 40 psi/min until 1920 psi was reached. The part was cured at 350° C. for 1 hr and 400° C. for ½ hr. The mold was cooled and the molded rectangular part (3.25"×1"×0.125") was removed.

COMPARATIVE EXAMPLE 1

The following experiment was conducted to show that the DASA end-capped materials of the present invention cure at higher temperatures than aminophenylacetylene (APA) capped oligomers.

Two isoimide resins were prepared with identical backbones ($n=3$; 3,4,3'4' benzophenone tetracarboxylic dianhydride (BTDA), 1,3-bis(3-aminophenoxy)benzene (APB) diamine), but different end-caps. One contained 3-APA as the end-cap and the other 3-PEA. These resins were analyzed by differential scanning calorimetry (DSC) and dynamic mechanical analysis (DMA). A DSC scan (10° C./min to 450° C.) on the PEA-capped material revealed two exotherms of roughly equal magnitude, 120 J/g (Joules per gram). The first, peaking at 253° C., is due to the intramolecular conversion from isoimide to imide, and the second, with a maximum at 404° C., is due to the crosslinking reaction of the PEA end groups. With the APA-capped polyisoimide, the isoimide to imide conversion and crosslinking occur simultaneously, producing an exotherm of 255 J/g centered at 260° C. On reheating, a cured Tg of about 230° C. is observed for both resins.

Glass cloth prepregs were prepared of each of the above resins by coating with a tetrahydrofuran (THF) solution and then drying. These prepregs were analyzed by dynamic mechanical analysis (DMA) using a Dupont 982 instrument. As the resin on the glass cloth softens and liquifies the tensile storage modulus (E') drops. For the PEA-capped material, the curing reaction does not occur appreciably until about 340° C., as detected by an increase in E' with temperature. In contrast, the APA-capped resin begins to cure appreciably fast at only about 210° C.

COMPARATIVE EXAMPLE 2

As further proof of the long melt processing time at elevated temperatures of these DASA-capped polyimides, an experiment was conducted in a Brabender Plasticorder. A small (20 ml) stainless steel mixing bowl was coupled to the Plasticorder drive. After preheating the bowl to 240° C., 24 grams of a polyisoimide prepared as described above (ODPA/bis-P/3-PEA $n=10$ isoimide) were added to the bowl. The torque on the mixing blades was monitored and also the temperature of the sample. The sample temperature rose to 265° C. and stabilized. A viscous melt was obtained which thickened by less than 10% during the 75 minute hold. The temperature of the mixing bowl was then raised to 350° C. The melt itself reached 367° C. Once the melt reached this temperature it cured in 6 min. as evidenced by a decrease in torque due to fracture of the cured resin.

Two experiments on APA-capped polyimides were conducted in the Plasticorder for comparison with the results described above. In the first experiment, the mixing bowl was heated to 200° C. and 24 grams of BTDA/APB/3-APA $n=1$ isoimide oligomer were added. A viscous melt was formed which stabilized at 204° C. prior to the reaction exotherm (217° C.). When the polyimide cured it fractured into crumbs and the torque rapidly dropped. The total curing time from temperature equilibration to fracture of the cured polymer was less than 4 minutes.

A similar experiment was conducted on the analogous $n=15$ oligomer, but this time the bowl was preheated to 210° C. and the melt temperature equilibrated at 238° C. prior to exotherming to about 250° C. The total time from temperature equilibration to fracture of the cured polymer was 5 minutes.

These experiments demonstrate that APA-capped polyimides have much shorter processing times prior to cure, even at lower temperatures, than DASA-capped polyimides.

Now that the preferred embodiments of the present invention have been described in detail, various modifications and improvements thereon will become readily apparent to those skilled in the art. Accordingly, the spirit and scope of the invention are to be limited only by the appended claims and not by the foregoing specifications.

We claim:

1. A polymerizable oligomer selected from the group consisting of polyamic acids, corresponding amic esters, corresponding isoimides, corresponding imides, and mixtures thereof, and wherein said polymerizable oligomer is end-capped with a diaryl substituted acetylene (DASA) having the general formula:

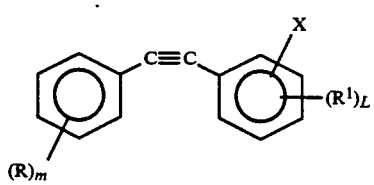

wherein $m=0$ to 5, $L=0$ to 4, R and $R^1$ are independently selected from the group consisting of halogen, $C_1$-$C_4$ alkyl, alkoxy, aryloxy, haloaryl, haloalkyl, haloacyl, aryl, and acyl, and X is a linking group to the oligomer backbone selected from the group consisting of NH₂, CHO, isocyanate, anhydride, carboxylic acid, ester, and acyl halide; provided that m or L≠0 when the oligomer backbone is composed of 2,2-bis(3,4-dicarboxyphenyl) hexafluoropropane dianhydride and 1,3-bis(3-amino-phenoxy) benzene and X=NH₂; and said polymerizable oligomer must have a glass transition temperature (Tg) greater than 135° C. after imidization, but prior to the onset of cure of the DASA end-caps.

2. The cured polyimide according to claim 1.

3. The oligomer according to claim 1, having a glass transition temperature (Tg) greater than 160° C. after imidization, but prior to the onset of cure of the DASA end caps.

4. The oligomer according to claim 1, wherein DASA has the structure:

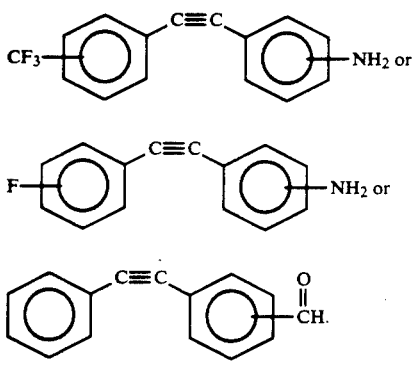

5. The polymerizable oligomer according to claim 1, having the following general formula:

(DASA)—B$_p$—(AB)—$_n$A$_r$—(DASA)

where A is a diamine, B is a dianhydride or a tetracid, tetraester, diester diacid, or dihaloformyldiester of a dianhydride or combinations thereof, (AB)$_n$ is the reaction product of A and B, n is 0 to 100, p and r are 0 or 1, but p is 0 when r is 1, and p is 1 when r is 0.

6. The oligomer according to claim 5, wherein the diamine is a primary aromatic diamine selected from the group consisting of phenylene diamine, oxydianiline, bisanilines, and mixtures thereof.

7. A monomeric mixture of A, DASA and B, wherein B is selected from the group consisting of either a tetracid, tetraester or a diacid diester of a dianhydride, A and DASA are defined as in claim 5 to produce said polymerizable oligomer according to claim 5 upon heating.

8. The oligomer according to claim 5, wherein the dianhydride is an aromatic dianhydride selected from the group consisting of benzophenone tetracarboxylic dianhydride, biphenyl tetracarboxylic dianhydride, pyromellitic dianhydride, oxydiphthalic-dianhydride, 5,5'-[2,2,2-trifluoro-1-(trifluoromethyl)ethylidene]bis-1,3-isobenzofurandione (6FDA), and mixtures thereof.

9. The oligomer according to claim 5, wherein the dianhydride is benzophenone tetracarboxylic dianhydride, the diamine is bisaniline, and n is 1 to 15.

10. The oligomer according to claim 5, wherein the dianhydride is biphenyl tetracarboxylic dianhydride, the diamine is phenylene diamine and n is 1 to 15.

11. The oligomer according to claim 5, wherein the dianhydride is 5,5'-[2,2,2-trifluoro-1-(trifluoromethyl)ethylidene] bis-1,3-isobenzofurandione, the diamine is 1,4-phenylene diamine and n is 1 to 15.

12. The oligomer according to claim 5, wherein the dianhydride is 3,4,3',4'-oxydiphthalic dianhydride, the diamine is 4,4'-oxydianiline and n is 1 to 15.

13. A polymerizable oligomer selected from the group consisting of polyamic acids, corresponding amic esters, corresponding isoimides, corresponding imides, and mixtures thereof, and wherein said polymerizable oligomer is end-capped with a diaryl substituted acetylene (DASA) having the general formula:

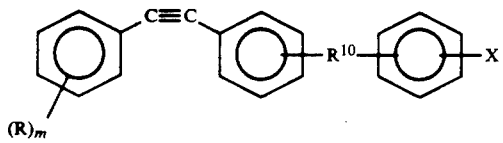

wherein m=0 to 5, R is selected from the group consisting of halogen, C₁-C₄ alkyl, alkoxy, aryloxy, haloaryl, haloalkyl, haloacyl, aryl, and acyl, R¹⁰ is —O—, —S—, —C(CF₃)₂—, SO₂,

—CH₂—, or —C(CH₃)₂—, and X is a linking group to the oligomer backbone selected from the group consisting of NH₂, CHO, isocyanate, anhydride, carboxylic acid, ester, and acyl halide.

14. The oligomer according to claim 13, wherein DASA has the structure:

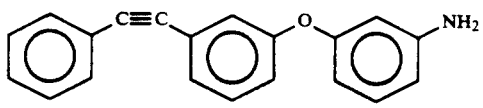

15. A composite prepared by combining reinforcing fibers with a polymerizable oligomer selected from the group consisting of polyamic acids, corresponding amic esters, corresponding isoimides, corresponding imides, and mixtures thereof, and wherein said polymerizable oligomer is end-capped with a diaryl substituted acetylene (DASA) having the general formula:

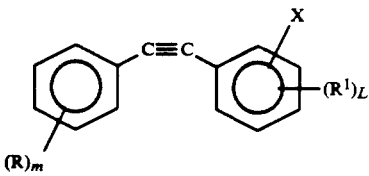

wherein m=0 to 5, L=0 to 4, R and R¹ are independently selected from the group consisting of halogen, C₁-C₄ alkyl, alkoxy, aryloxy, haloaryl, haloalkyl, haloacyl, aryl and acyl, and X is a linking group to the oligomer backbone selected from the group consisting of NH₂, CHO, isocyanate, anhydride, carboxylic acid, ester, and acyl halide; provided that m or L≠0 when the oligomer backbone is composed of 2,2-bis(3,4-dicarboxyphenyl) hexafluoropropane dianhydride and 1,3-bis(3-amino-phenoxy) benzene and X=NH₂, said oligomer having a glass transition temperature (Tg) greater than 135° C. after imidization, but prior to the onset of cure of the DASA end-caps.

16. The composite according to claim 15, wherein the fibers are carbon, aramid, glass, quartz, or silicon carbide.

17. A molded article prepared from the composition according to claim 1.

18. A molded article according to claim 17 prepared from a mixture of the polymerizable oligomer and less than 60 volume % filler.

19. An electronic device containing or encapsulated with a cured oligomer according to claim 2.

20. A method for forming dielectrically isolated island regions in a semiconductor substrate comprising:
(a) forming in said substrate a recess trench pattern defining a plurality of isolated island regions,
(b) filling said trenches with a composition containing the oligomer according to claim 1,
(c) curing said composition in situ in the trenches to form an imidized three dimensional dielectric polyimide therein.

21. A method of forming multilevel metallurgy on a substrate having an integrated circuit device, comprising:
(a) applying a coating composition containing the oligomer according to claim 1 to the surface of said substrate comprising the integrated circuit device thereby filling and substantially planarizing the substrate surface,
(b) curing the composition to form a three dimensional imidized layer thereof,
(c) forming via openings in the imidized layer extending to conductive portions of the integrated circuit device, and
(d) forming a conductive pattern on the imidized layer and the openings to at least one of the underlaying conductive portions of the integrated circuit device.

22. An electronic component comprising an electric insulator that isolates portions of a substrate having circuitry formed therein containing the oligomer according to claim 2.

23. A substrate having a plurality of vertically spaced conductor patterns interconnected to each other and separated by an electric insulator therebetween, said insulator containing the curable composition according to claim 1, said curing being effected prior to the inclusion of an overlaying layer on said conductor pattern.

24. A semiconductor substrate containing isolated island regions separated by a trench pattern containing in situ cured polyimide obtained by curing a composition containing the oligomer according to claim 1.

25. A semiconductor substrate comprising isolated regions wherein said isolated regions comprise deep dielectric isolation cavities filled with a polyimide, and wherein said polyimide is obtained by in situ curing a composition containing the oligomer according to claim 1.

26. An adhesive containing the oligomer according to claim 1.

27. An adhesive according to claim 26, wherein the adhesive contains a thermally conductive filler selected from the group consisting of magnesium oxide, calcium carbonate, silicon dioxide, titanium dioxide, alumina, and diamond.

28. An adhesive according to claim 26, wherein the filler is electrically conductive and selected from the group consisting of powdered or flaked metal, or a mixture of powdered and flaked metal.

29. A composite prepared by combining reinforcing fibers with a polymerizable oligomer selected from the group consisting of polyamic acids, corresponding amic esters, corresponding isoimides, corresponding imides, and mixtures thereof, and wherein said polymerizable oligomer is end-capped with a diaryl substituted acetylene (DASA) having the general formula:

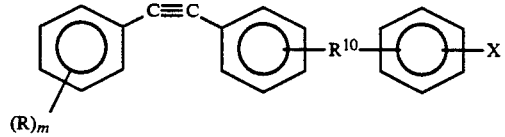

wherein m=0 to 5, R is independently selected from the group consisting of halogen, $C_1$–$C_4$ alkyl, alkoxy, aryloxy, haloaryl, haloalkyl, haloacyl, aryl and acyl, $R^{10}$ is —O—, —S—, —C(CF$_3$)$_2$—, —SO$_2$—,

—CH$_2$—, or —C(CH$_3$)$_2$—, and X is a linking group to the oligomer backbone selected from the group consisting of NH$_2$, CHO, isocyanate, anhydride, carboxylic acid, ester, and acyl halide.

30. A moled article prepared from the composition according to claim 13.

31. An electronic device containing or encapsulated with the cured oligomer of claim 13.

32. An adhesive containing the oligomer according to claim 13.

* * * * *

REEXAMINATION CERTIFICATE (3082nd)

United States Patent [19]
Paul et al.

[11] B1 5,138,028
[45] Certificate Issued Dec. 24, 1996

[54] POLYIMIDES END-CAPPED WITH DIARYL SUBSTITUTED ACETYLENE

[75] Inventors: Charles W. Paul, Madison; Rose A. Schultz, Princeton; Steven P. Fenelli, Hillsborough, all of N.J.

[73] Assignee: National Starch and Chemical Investment Holding Corporation, Wilmington, Del.

Reexamination Request:
No. 90/004,069, Nov. 3, 1995

Reexamination Certificate for:
Patent No.: 5,138,028
Issued: Aug. 11, 1992
Appl. No.: 823,508
Filed: Jan. 21, 1992

Related U.S. Application Data

[63] Continuation-in-part of Ser. No. 482,362, Feb. 20, 1990, abandoned.

[51] Int. Cl.$^6$ .............. C08G 69/26; C08G 8/02; C08G 75/00; C08F 22/40
[52] U.S. Cl. .............. 528/353; 526/262; 528/125; 528/128; 528/172; 528/208; 528/262
[58] Field of Search ............... 528/353, 125, 528/128, 172, 208; 526/262

[56] References Cited

U.S. PATENT DOCUMENTS

| | | | |
|---|---|---|---|
| 4,038,320 | 7/1977 | Arnold et al. | 260/578 |
| 4,045,409 | 8/1977 | Arnold et al. | 260/49 |
| 5,037,949 | 8/1991 | Mueller et al. | 528/353 |
| 5,066,550 | 10/1991 | Mueller et al. | 528/353 |
| 5,066,771 | 11/1991 | Hino et al. | 528/363 |
| 5,312,994 | 5/1994 | Bryant | 568/306 |
| 5,344,982 | 9/1994 | Hergenrother et al. | 564/330 |

OTHER PUBLICATIONS

F. W. Harris, et al., "Syntheses and Characterization of Reactive End–Capped Polyimide Oligomers", Polymer Preprints, 24(2), pp. 324–325 (1983).

F. W. Harris et al. "Synthesis and Characterization of Reactive End–Capped Polyimide Oligomers", J. Macromol. Sci. Chem., A21 (8 and 9), pp. 1117–1135 (1984).

C. W. Paul et al., "High–temperature–curing end caps for polyimide oligomers" (no date).

R. G. Bryant et al., "Synthesis and properties of phenylethynyl–terminated polyimides", Polymer Preprints, vol. 34, No. 1 (Mar. 1993).

*Primary Examiner*—Terressa M. Mosley

[57] ABSTRACT

Novel polyimide and polyisoimide oligomers and precursors thereof, end-capped with diaryl substituted acetylene.

These novel end-capped polyimide or polyisoimides oligomers are useful for composites, molding compounds, adhesives, and electronic applications.

B1 5,138,028

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–32 is confirmed.

* * * * *